United States Patent
Zheng et al.

(10) Patent No.: US 9,886,194 B2
(45) Date of Patent: Feb. 6, 2018

(54) NVDIMM ADAPTIVE ACCESS MODE AND SMART PARTITION MECHANISM

(71) Applicants: Hongzhong Zheng, Sunnyvale, CA (US); Dimin Niu, Sunnyvale, CA (US)

(72) Inventors: Hongzhong Zheng, Sunnyvale, CA (US); Dimin Niu, Sunnyvale, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 15 days.

(21) Appl. No.: 14/957,568

(22) Filed: Dec. 2, 2015

(65) Prior Publication Data

US 2017/0017402 A1    Jan. 19, 2017

Related U.S. Application Data

(60) Provisional application No. 62/192,028, filed on Jul. 13, 2015.

(51) Int. Cl.
  *G06F 3/06* (2006.01)
  *G06F 12/02* (2006.01)
  *G11C 8/06* (2006.01)
  *G11C 16/08* (2006.01)

(52) U.S. Cl.
  CPC ......... *G06F 3/0605* (2013.01); *G06F 3/0634* (2013.01); *G06F 3/0679* (2013.01); *G06F 12/0246* (2013.01); *G11C 8/06* (2013.01); *G11C 16/08* (2013.01)

(58) Field of Classification Search
  CPC .... G06F 3/0605; G06F 3/0631; G06F 3/0634; G06F 3/0679; G06F 12/0238; G06F 3/0644; G06F 12/0246
  See application file for complete search history.

(56) References Cited

U.S. PATENT DOCUMENTS

| 6,141,739 | A | * | 10/2000 | Provence ................ G06F 12/04 711/211 |
| 6,496,916 | B1 | * | 12/2002 | Fadavi-Ardekani ..... G11C 8/12 710/40 |
| 8,832,408 | B2 | | 9/2014 | Nazarian et al. |
| 8,880,777 | B2 | * | 11/2014 | Kim .................... G06F 12/0246 711/103 |
| 9,396,769 | B1 | * | 7/2016 | Chang ................. G06F 12/0246 |
| 2005/0251617 | A1 | | 11/2005 | Sinclair et al. |

(Continued)

*Primary Examiner* — Hal Schnee

(74) *Attorney, Agent, or Firm* — Renaissance IP Law Group LLP

(57) ABSTRACT

A system and method for using a Non-Volatile Dual In-Line Memory Module (NVDIMM) (110, 115) is disclosed. The NVDIMM (110, 115) can support two or more access modes. An application can specify which access mode is desired for an address space requested by the application. A Non-Volatile Memory (NVM) governor (150) can store an address mask and the access mode for the address space (305, 310, 315) in an NVM control register (155). When the application requests read or write access to an address (605), the NVM governor (150) can compare the requested address (605) with the address masks in the NVM control register (155), determine the access mode from the access mode corresponding to the matched address mask, and use that access mode to satisfy the request for the address (605).

27 Claims, 12 Drawing Sheets

(56) References Cited

U.S. PATENT DOCUMENTS

| | | | |
|---|---|---|---|
| 2006/0069849 A1* | 3/2006 | Rudelic | G06F 12/0246 711/103 |
| 2006/0143396 A1* | 6/2006 | Cabot | G06F 12/121 711/134 |
| 2008/0250220 A1* | 10/2008 | Ito | G06F 12/0246 711/173 |
| 2011/0060887 A1* | 3/2011 | Thatcher | G06F 3/0604 711/171 |
| 2012/0011300 A1* | 1/2012 | Hung | G06F 12/0246 711/103 |
| 2012/0185640 A1* | 7/2012 | Hung | G06F 13/1694 711/103 |
| 2013/0117632 A1* | 5/2013 | Fujinami | G06F 11/1012 714/763 |
| 2013/0275661 A1* | 10/2013 | Zimmer | G06F 12/0246 711/103 |
| 2014/0181365 A1* | 6/2014 | Fanning | G06F 12/0246 711/103 |
| 2014/0208016 A1* | 7/2014 | Malik | G11C 15/04 711/108 |
| 2016/0253123 A1* | 9/2016 | Jacob | G06F 13/1694 711/103 |
| 2016/0321083 A1* | 11/2016 | Costa | G06F 9/4401 |
| 2016/0378672 A1* | 12/2016 | Dulloor | G06F 12/0891 711/135 |
| 2017/0068452 A1* | 3/2017 | Xia | G06F 12/00 |

* cited by examiner

NVDIMM ADAPTIVE ACCESS MODE AND SMART PARTITION MECHANISM

RELATED APPLICATION DATA

This application claims the benefit of U.S. Provisional Patent Application Ser. No. 62/192,028, filed Jul. 13, 2015, which is incorporated by reference herein.

FIELD

This inventive concept relates to memory, and more particularly to a Non-Volatile Dual In-Line Memory Module (NVDIMM) that supports multiple access modes.

BACKGROUND

The Non-Volatile Dual In-Line Memory Module (NVDIMM) places non-volatile memory into the memory channel in a Dual In-Line Memory Module (DIMM) form factor. But NVDIMM introduces a new wrinkle not generally found in DRAM. Whereas DIMMs normally only support byte-addressable storage (although DIMMs can support block-addressable storage with help from the operating system), NVDIMMs can support either byte-addressable or block-addressable storage.

A simple solution would be to force the NVDIMM to use only one addressing mode: that is, a particular NVDIMM functions only as either byte-addressable main memory/storage or block-addressable storage, not both. But this is a simplistic solution; and even as a simplistic solution, this approach does not work in all situations.

Because different applications can have different memory requirements, limiting an NVDIMM to a particular address mode can lead to suboptimal utilization of resources. One NVDIMM, using one access mode, might be overworked, while another NVDIMM, using a different address mode, might be underutilized. And this scenario assumes that a computer system includes multiple NVDIMMs. If the computer system includes only one NVDIMM, then an access mode not offered by that NVDIMM might be completely unavailable.

A need remains for a way to permit the use of multiple access modes in an NVDIMM.

DETAILED DESCRIPTION

Figure 1:
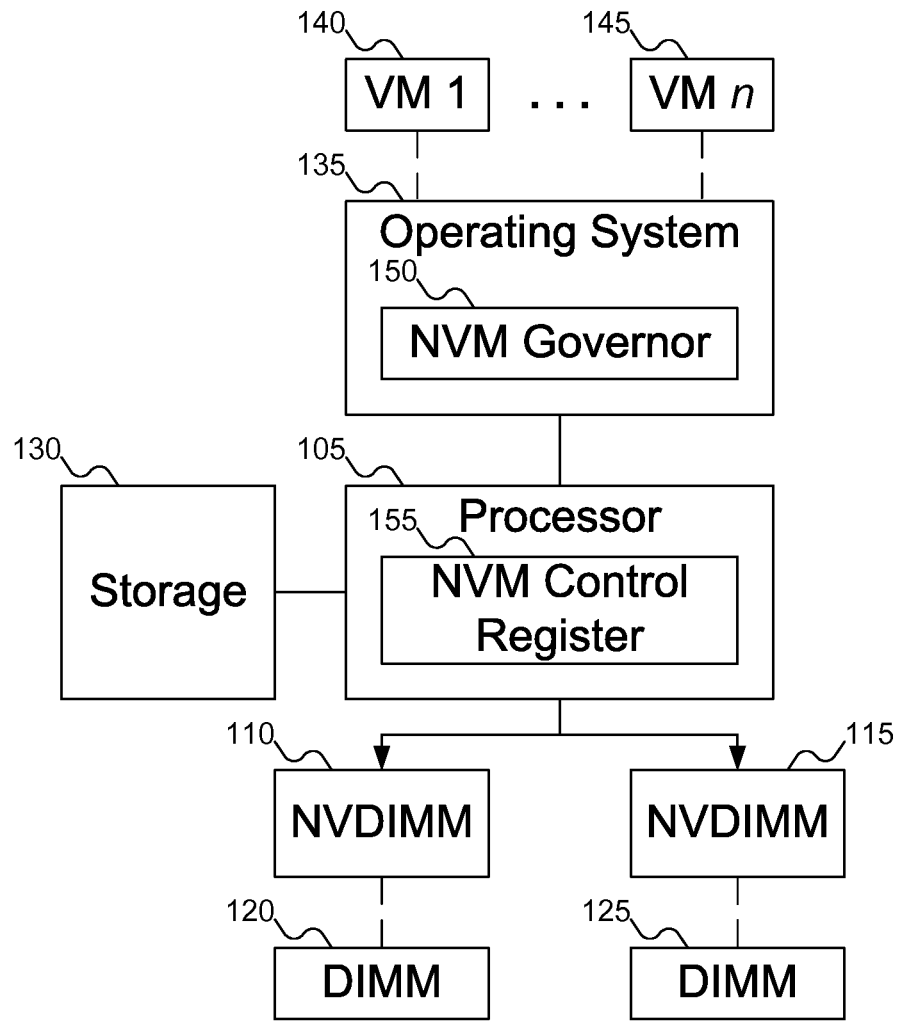
FIG. 1 shows a computer system using Non-Volatile Dual In-Line Memory Modules (NVDIMMs) for memory or storage on the memory channel, according to an embodiment of the inventive concept.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments of the inventive concept can include a Non-Volatile Dual In-Line Memory Module (NVDIMM) with an adaptive access mode and smart partitioning mechanism. To implement the smart partitioning mechanism, a Non-Volatile Memory (NVM) governor can include hardware and/or software modules configured to allocate address spaces in the NVDIMM in either byte- or block-addressable mode, as requested by an application. The NVM governor can dynamically partition the NVDIMM into byte- and block-addressable portions at runtime according to application behaviors. The smart partition mechanism can also include an NVM control register, which can store which address ranges have which access modes.

The NVM governor can accept application requests for NVDIMM address space with a related access mode (applications can request more than one address space with different access modes). The NVM governor can store information in the NVM control register, such as an address mask and access mode corresponding to the requested address space and mode.

To process read and write requests to an address space, the NVM governor can check the address masks in the NVM control register, either individually or in parallel. When a match to the address space and access mode is found, the NVM governor can schedule the request with the selected access mode.

FIG. 1 shows a computer system using Non-Volatile Dual In-Line Memory Modules (NVDIMMs) in the memory channel, according to an embodiment of the inventive concept. In FIG. 1, processor 105 is shown. Processor 105 can be coupled to memory modules, such as NVDIMMs 110 and 115. Processor 105 can also be coupled to other memory modules, such as DIMMs 120 and 125. In some embodiments of the inventive concept, all memory modules can be used equivalently. In other embodiments of the inventive concept, DIMMs 120 and 125 can act as a cache for NVDIMMs 110 and 115. Other embodiments of the inventive concept can use NVDIMMs 110 and 115, DIMMs 120 and 125, and other memory and/or storage devices in any desired manner: for example, by layering different memory and storage devices in a hierarchy that optimizes the properties of the devices.

Processor 105 can also be coupled to storage 130. Storage 130 can be any desired storage, including technologies such as hard disk drives (HDDs), Solid State Drives (SSDs), and/or other non-volatile memory technologies. In addition, storage 130 can include a mix of different storage types: for example, both an HDD and an SSD. Finally, storage 130 can be connected to processor 105 in any desired manner, including a direct connection via a bus or through an interface to an external storage, such as Universal Serial Bus (USB) interface.

Processor 105 can support the operation of operating system 135. Operating system 135 can be any desired operating system, supporting the operation of only one application at a time or any number of applications in parallel. In addition, operating system 135 can support virtual machines, which provide each virtual machine the appearance of complete use of all resources within the computer system. In FIG. 1, n virtual machines 140-145 are shown as being supported by operating system 135.

Operating system 135 can include Non-Volatile Memory (NVM) governor 150. NVM governor 150 can manage the allocation of address spaces within NVDIMMs 110 and 115 and the processing of read/write requests from address spaces within NVDIMMs 110 and 115. Supporting the operation of NVM governor 150 is NVM control register 155, which can be stored in processor 105, or can be stored in a memory controller, among other possibilities. As described further below with reference to FIGS. 4-6, NVM control register 155 can store information about how the address spaces are used, including, for example, and address mask and an access mode. The address mask can include a particular bit pattern that matches the most significant bits in all addresses in the address space. The access mode can specify how data is read from/written to addresses in the NVDIMM. Currently, reading and writing is performed using byte-addressable mode or block-addressable mode. Given that there are currently only two access modes, an access mode can be represented using a single bit. But if additional access modes are designed, the access mode stored in NVM control register 155 can use additional bits.

Figure 2:
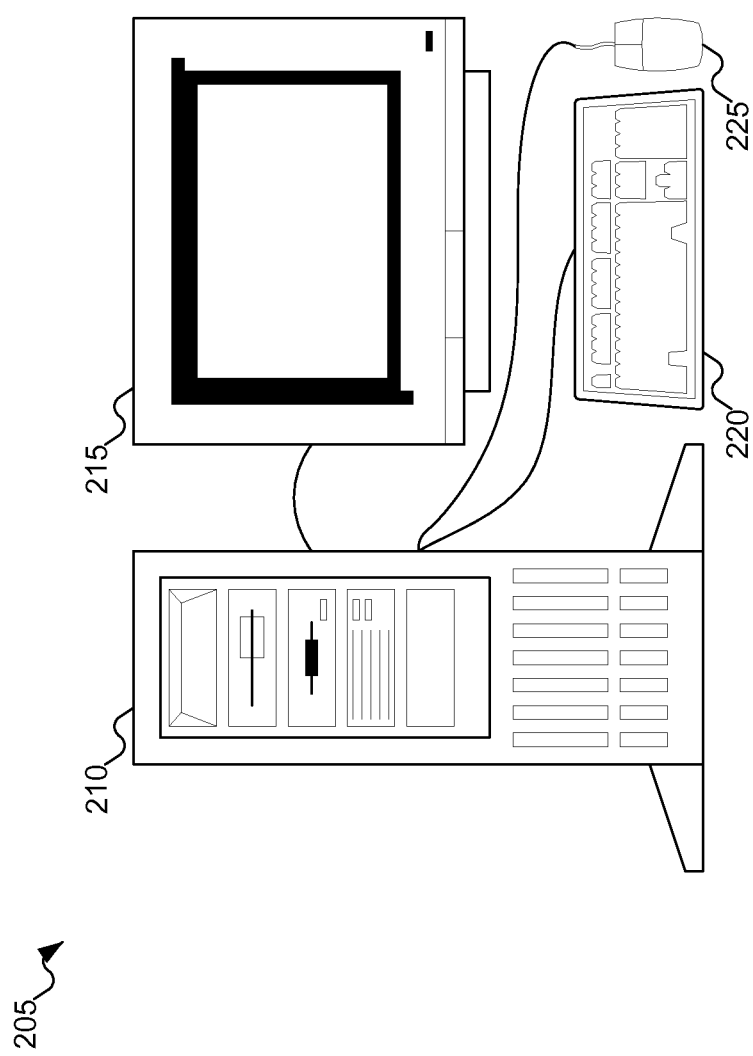
FIG. 2 shows exterior features of the computer system of FIG. 1.

FIG. 2 shows exterior features of the computer system of FIG. 1. In FIG. 2, computer system 205 is shown. Computer system 205 is shown as including computer 210, monitor 215, keyboard 220, and mouse 225. A person skilled in the art will recognize that other components can be included with computer system 205: for example, other input/output devices, such as a printer, may be included. In addition, computer system 205 can include conventional internal components shown in FIG. 1, such as central processing unit 105, NVDIMMs 110 and 115, DIMMs 120 and 125, storage 130, etc. Although not shown in FIG. 2, a person skilled in the art will recognize that computer system 205 can include other internal components, such as other graphics cards, modems, etc. In addition, a person skilled in the art will recognize that computer system 205 can interact with other computer systems, either directly or over a network (not shown) of any type. Finally, although FIG. 2 shows computer system 205 as a conventional desktop computer, a person skilled in the art will recognize that computer system 205 can be any type of machine or computing device, including, for example, a laptop computer, a tablet computer, a personal digital assistant (PDA), or a smart phone, among other possibilities.

Figure 3:
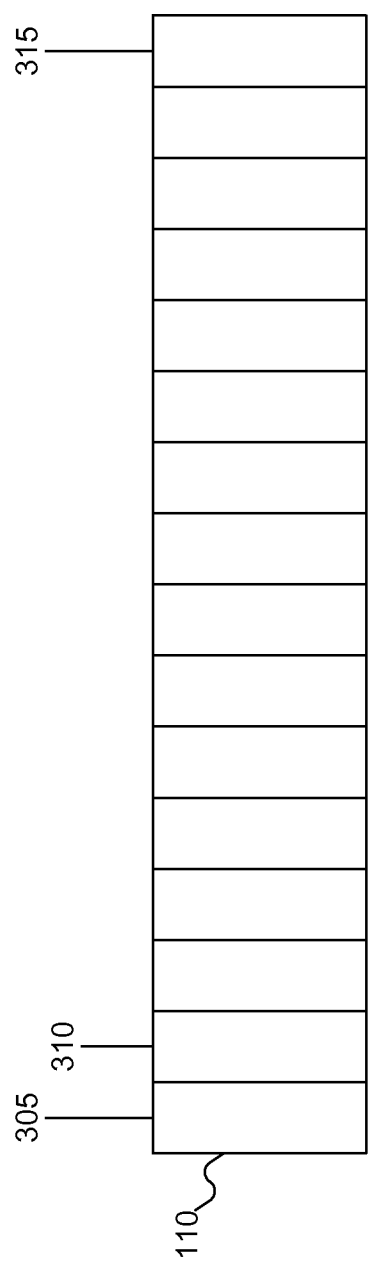
FIG. 3 shows the NVDIMM of FIG. 1 divided into address spaces.

FIG. 3 shows NVDIMM 110 of FIG. 1 divided into address spaces. In FIG. 3, NVDIMM 110 is shown, but what is described is equally applicable to NVDIMM 115 of FIG. 1. NVDIMM 110 is shown as divided into 16 address spaces, including address spaces 305, 310, and 315. Each address space 305, 310, and 315 can be a portion of NVDIMM 110 that is allocated for some application. It can also occur that multiple different address spaces 305, 310, and 315 are allocated to the same application (that is, an individual application is not limited to using a single address space 305, 310, and 315 in NVDIMM 110). In addition, each address space 305, 310, and 315 can use any access mode: address spaces 305, 310, and 315 within a single NVDIMM like NVDIMM 110, or even address spaces 305, 310, and 315 used by a single application, can use whatever access mode is desired. NVM governor 150 of FIG. 1 can be responsible for specifying the size of address spaces 305, 310, and 315 when they are allocated in response to an application request.

Although FIG. 3 shows NVDIMM 110 divided into 16 address spaces, the number of address spaces allocated within NVDIMM 110 can be greater or fewer than 16. In addition, while FIG. 3 suggests that each address space 305-315 is the same size (that is, each address space 305-315 includes the same number of addresses in NVDIMM 110), address spaces 305, 310, and 315 can be of any desired size, bounded only the size of NVDIMM 110 itself. For example, address space 305 might be capable of storing only 8 KB of data, whereas address space 310 might be capable of storing 48 MB of data. (These described sizes for address spaces 305, 310, and 315 are, again, merely exemplary, and are not intended to imply any limits on the size of individual address spaces 305, 310, and 315 within NVDIMM 110.)

In addition, NVM governor 150 of FIG. 1 can also resize address spaces 305, 310, and 315. For example, assume that address space 305 was initially allocated to store 1 MB of data. While executing, the application using address space 305 requests additional memory and/or storage from NVM governor 150 of FIG. 1. NVM governor 150 of FIG. 1 can simply allocate an additional address space 310 or 315 and assign it to the application. But if the additional memory and/or storage requested by the application uses the same access mode as address space 305, and there are available addresses adjacent to address space 305 (that is, address space 310 has not yet been allocated), then NVM governor 150 of FIG. 1 can enlarge address space 305 to include the adjacent addresses.

While the above example describes increasing the size of address spaces 305, 310, and 315, the size of address spaces 305, 310, and 315 can be shrunk in a similar manner. If the application indicates that it wants to release some unneeded memory and/or storage, that memory and/or storage can be considered unallocated by NVM governor 150 of FIG. 1 and used to satisfy a later request for memory and/or storage.

As will be described further below with reference to FIGS. 5-6, NVM control register 155 of FIG. 1 can store address masks for each address space 305, 310, and 315. These address masks can be used to determine which address space 305, 310, and 315 includes a particular address. If address spaces 305, 310, and 315 is resized as described above, the address mask associated with that address space 305, 310, and/or 315 can be changed to reflect the new resized address space 305, 310, and/or 315. For example, if address space 305, 310, and/or 315 is expanded, the associated address mask can include fewer bits; if address space 305, 310, and/or 315 is shrunk, the associated address mask can include additional bits.

The number of bits in an address mask can affect the size of address spaces 305, 310, and 315. For example, assume that an individual address includes 64 bits. If 48 bits are used for an address mask, then 16 (least significant) bits would be used to distinguish addresses within that address space. This would mean that address spaces 305, 310, and 315 stores 65,536 bits, or 8192 bytes, of data. If the application were to request that address space 305, 310, and/or 315 be expanded to store, for example, 16,777,216 bits, or 2,097,152 bytes, then the address mask could be reduced from 48 bits to 40 bits.

One consequence of how the length of the address mask can affect the size of address space 305, 310, and/or 315 is that address spaces 305, 310, and 315 are sized as powers of two. But just because the sizes of address spaces 305, 310, and 315 are powers of two does not mean that the application must be given access to the entire address spaces 305, 310, and 315, although the portion of address spaces 305, 310, and 315 to which the application lacks access might end up unusable. To avoid having unusable memory and/or storage, if an application requires additional memory and/or storage that cannot appropriately be achieved by expanding address spaces 305, 310, and 315 to a power of two in size, different address spaces 305, 310, and 315 of different sizes can be used (with additional entries in NVM control register 155 of FIG. 1).

Figure 4:
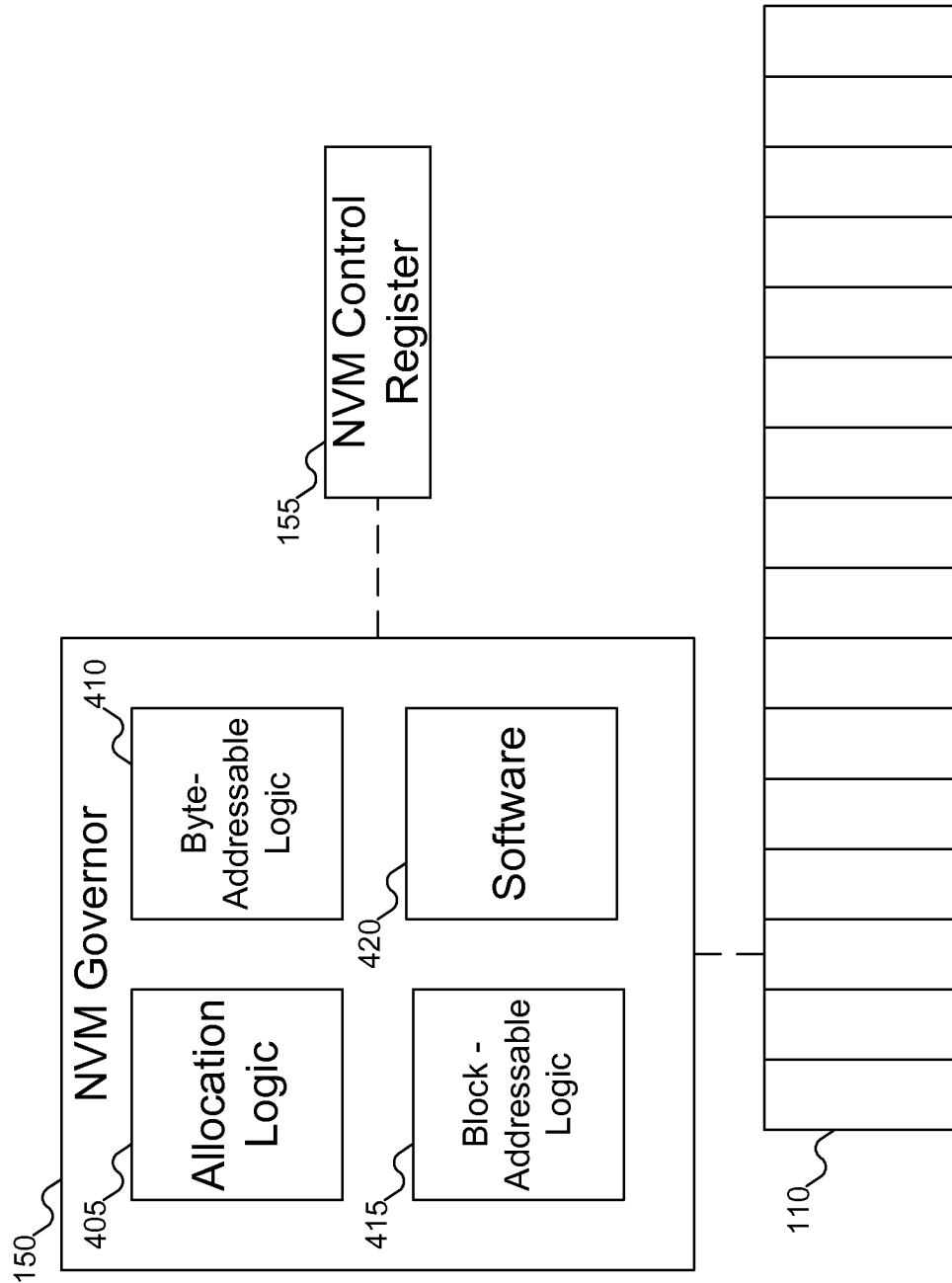
FIG. 4 shows the Non-Volatile Memory (NVM) governor of FIG. 1 interacting with the NVM control register of FIG. 1 and the NVDIMMs of FIG. 1.

FIG. 4 shows NVM governor 150 of FIG. 1 interacting with NVM control register 155 of FIG. 1 and NVDIMM 110 of FIG. 1. In FIG. 4, NVM governor 150 is shown as including allocation logic 405, byte-addressable logic 410, block-addressable logic 415, and software 420. Allocation logic 405 can allocate a portion of memory and/or storage from NVDIMM 110 as address space 305, 310, and/or 315 of FIG. 3 for an application, responsive to a request from the application. Byte-addressable logic 410 can access an address from address space 305, 310, and/or 315 of FIG. 3 in NVDIMM 110 using a byte-addressable access mode, and block-addressable logic 415 can access an address from address space 305, 310, and/or 315 of FIG. 3 in NVDIMM 110 using a block-addressable access mode. Finally, in some embodiments of the invention, instead of including block-addressable logic 415, software 420 can emulate block-addressable logic 415 using byte-addressable logic 410. That is, some embodiments of the inventive concept do not need to include block-addressable logic 415, as block access to memory and/or storage can be emulated by software 420, using byte-addressable logic 410.

NVM governor 150 stores data to and accesses data from NVM control register 155. When NVM governor 150 uses allocation logic 405, NVM governor 150 can store an address mask and an access mode in NVM control register 155. Then, when NVM governor 150 receives a request to access an address, NVM governor 150 can use the address masks and access modes stored in NVM control register 155 to determine what access mode to use when accessing the requested address.

Figure 5:
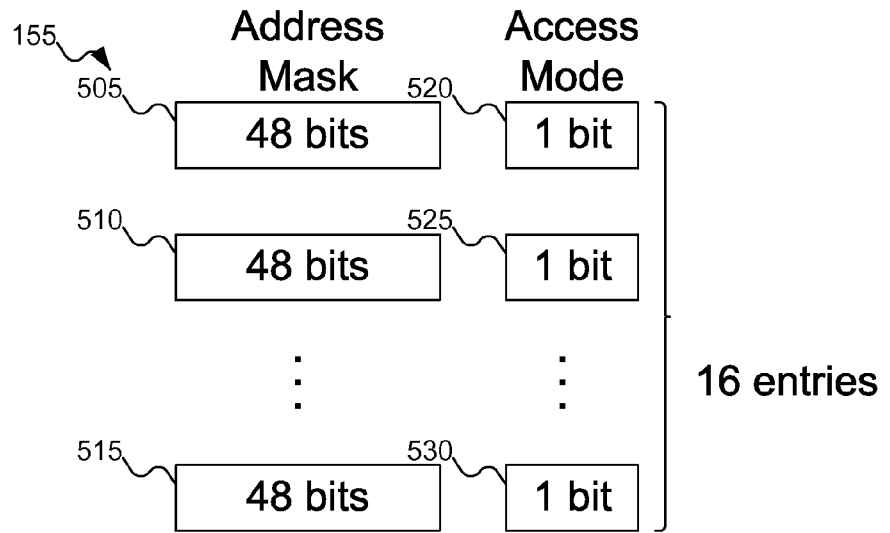
FIG. 5 shows the NVM control register of FIG. 1 storing 16 different address masks and access modes.

FIG. 5 shows an exemplary NVM control register 155 of FIG. 1 storing 16 different address masks and access modes. In FIG. 5, NVM control register 155 is shown as including address masks 505, address mask 510, and so on up to address mask 515, and corresponding access modes 520, access mode 525, and so on up to access mode 530. Each pair of an address mask and an access mode can associate with address space 305, 310, and/or 315 of FIG. 3 in NVDIMMs 110 or 115 of FIG. 1.

While FIG. 5 shows NVM control register 155 as storing 16 address masks and access modes, this is merely an example. NVM control register 155 can store any number of address masks and access modes. In addition, while FIG. 5 shows address masks as being 48 bits long and access modes as being one bit, these sizes are also examples. Address masks 505, 510, and 515 can be of any desired size, and can each be of different sizes. Similarly, while only one bit is needed to distinguish between two access modes (byte-addressable and block-addressable), if additional access modes are offered, access modes 520, 525, and 530 can include more than one bit.

Figure 6:
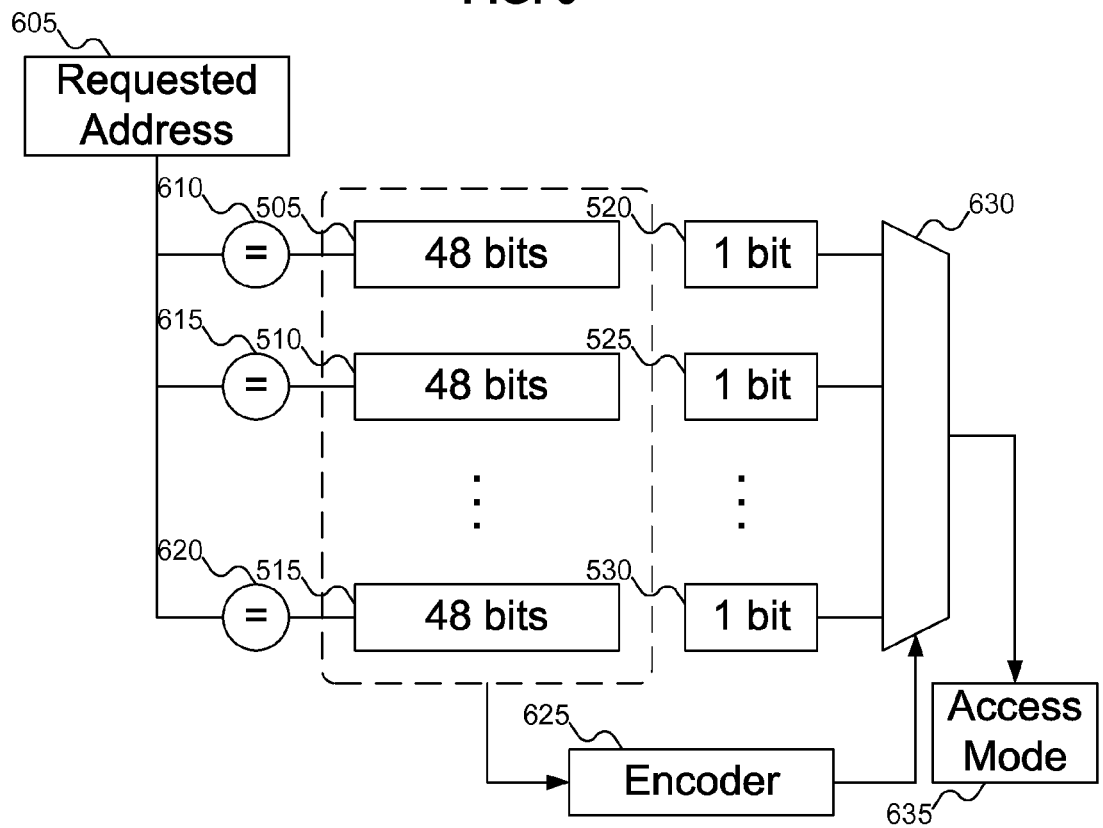
FIG. 6 shows the NVM governor of FIG. 1 using the NVM control register of FIG. 1 to determine the access mode for a requested address, according to an embodiment of the inventive concept.

FIG. 6 shows how NVM governor 150 of FIG. 1 can use NVM control register 155 of FIG. 1 to determine the access mode for a requested address, according to an embodiment of the inventive concept. In FIG. 6, required address 605 can be an address that an application wants to read or write. Comparator 610, comparator 615, and so on up to comparator 620 can then compare required address 605 with address masks 505, 510, and 515 to determine which address space 305, 310, or 315 of FIG. 3 includes required address 605. This comparison can involve checking to see which of the address masks matches the most significant bits in required address 605. Once the correct address mask has been identified, encoder 625 can use that information to generate a control signal for multiplexer 630 to select the corresponding access mode 520, 525, and 530. This selected access mode can be output as access mode 635.

Figure 7:
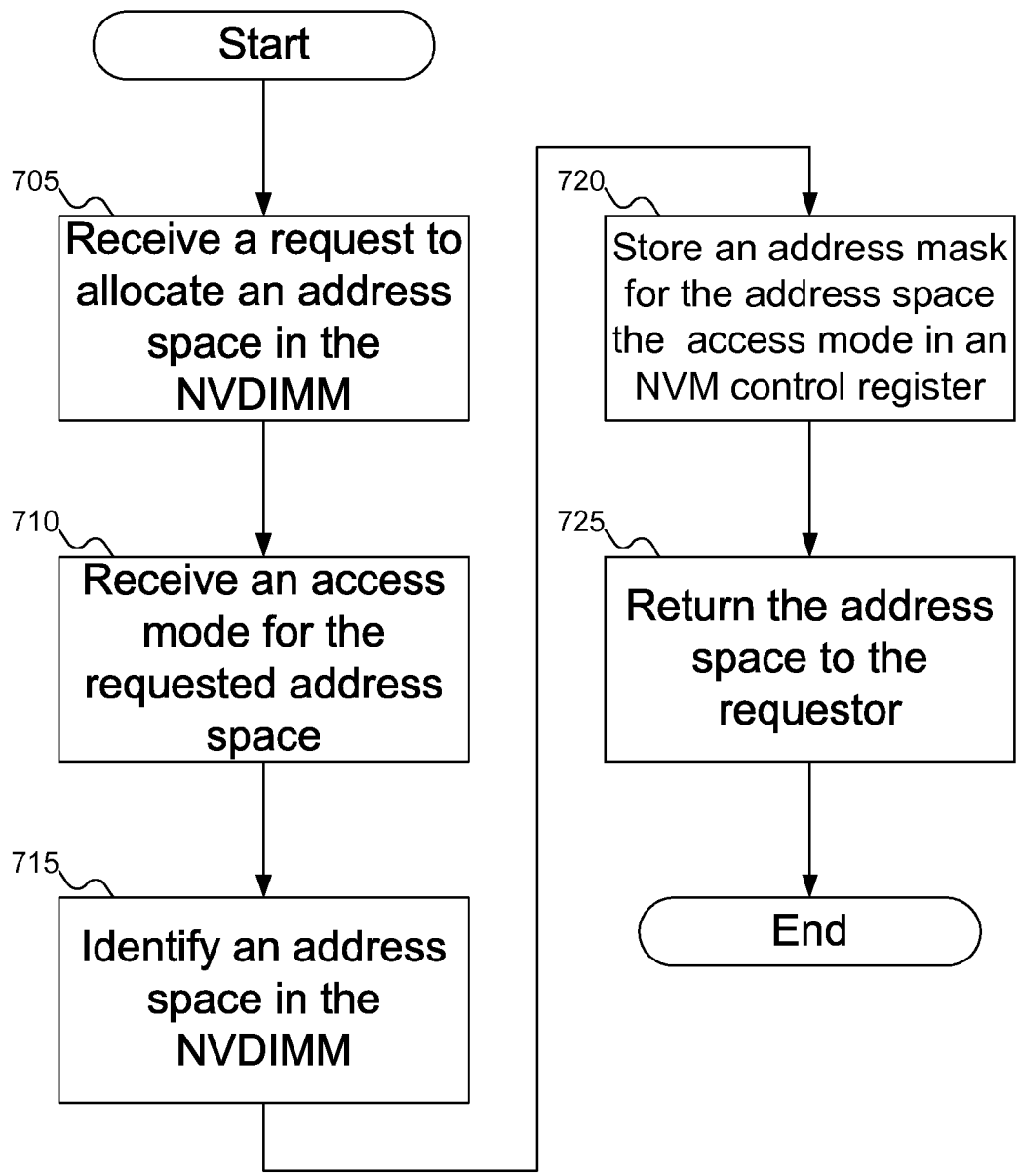
FIG. 7 shows a flowchart of a procedure for allocating an address space in an NVDIMM for an application, according to an embodiment of the inventive concept.

FIG. 7 shows a flowchart of a procedure for allocating an address space in NVDIMMs 110 and/or 115 for an application, according to an embodiment of the inventive concept. In FIG. 7, at block 705, NVM governor 150 of FIG. 1 can receive a request from an application to allocate NVM address spaces to the application. At block 710, NVM governor 150 of FIG. 1 can receive an access mode for the requested address space. At block 715, NVM governor 150 of FIG. 1 can identify an available address space 305, 310, and/or 315 of FIG. 3 in NVDIMM 110 and/or 115 of FIG. 1. At block 720, NVM governor 150 of FIG. 1 can store an address mask and access mode for the identified address space 305, 310, or 315 of FIG. 3 in NVM control register 155 of FIG. 1. Finally, at block 725, NVM governor 150 of FIG. 1 can return address space 305, 310, or 315 of FIG. 3 to the requesting application.

In FIG. 7 (and in the other flowcharts below), one embodiment of the invention is shown. But a person skilled in the art will recognize that other embodiments of the invention are also possible, by changing the order of the blocks, by omitting blocks, or by including links not shown in the drawings. All such variations of the flowcharts are considered to be embodiments of the invention, whether expressly described or not.

Figure 8:
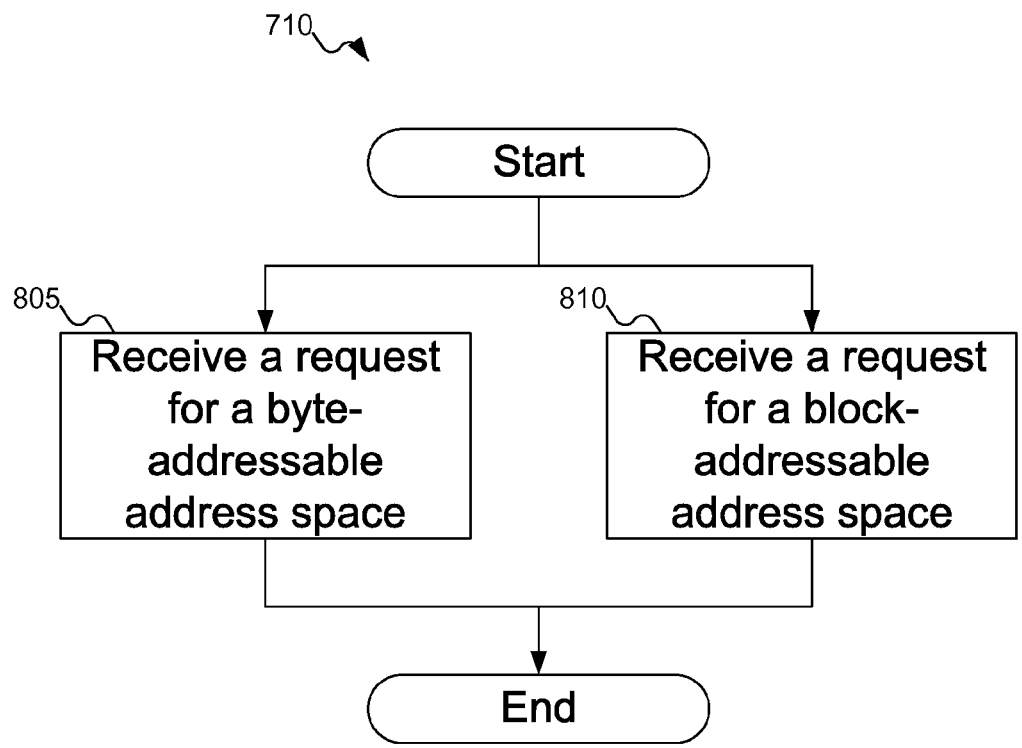
FIG. 8 shows a flowchart of a procedure for an NVM governor to determine the access mode used for newly allocated address space in an NVDIMM, according to an embodiment of the inventive concept.

FIG. 8 shows a flowchart of a procedure for NVM governor 150 of FIG. 1 to determine the access mode used for newly allocated address space in NVDIMM 110 and/or 115, according to an embodiment of the inventive concept. FIG. 8 elaborates on the operation of block 710 of FIG. 7. In FIG. 8, at block 805, NVM governor 150 of FIG. 1 can receive a request from an application for a byte-addressable address space. Alternatively, at block 810, NVM governor 150 of FIG. 1 can receive a request from an application for a block-addressable address space.

As described above, embodiments of the inventive concept consider two access modes: byte-addressable and block-addressable. FIG. 8 reflects these embodiments. But if additional access modes are introduced, FIG. 8 can be modified to reflect the use of additional access modes.

Figure 9:
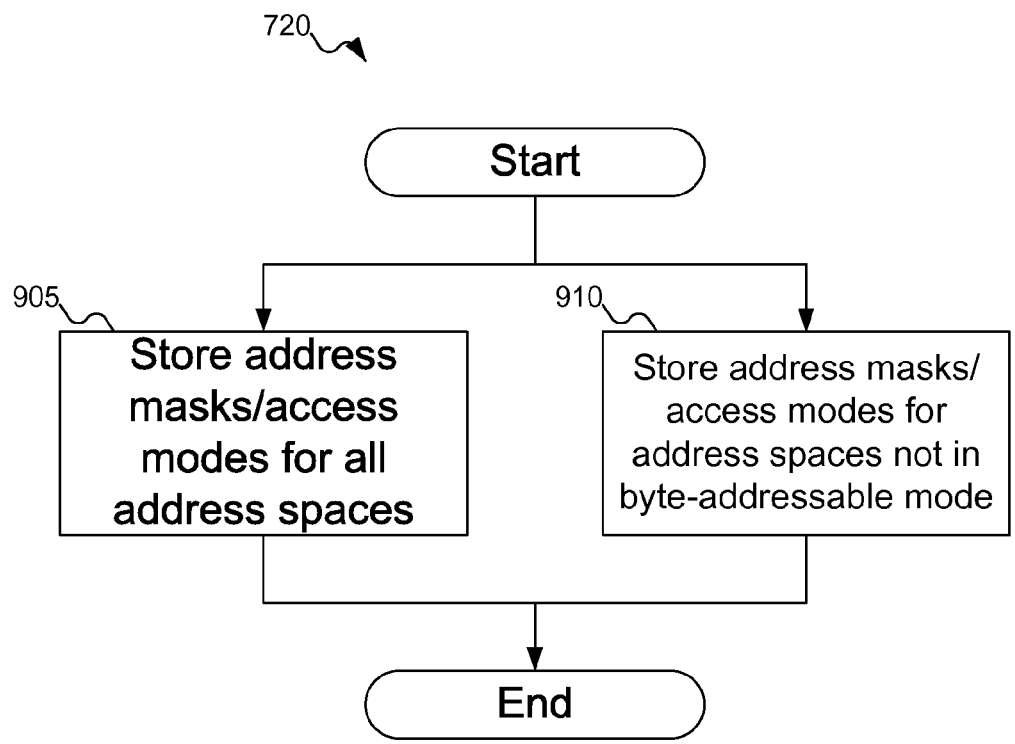
FIG. 9 shows a flowchart of a procedure for an NVM governor to store information about allocated address spaces in an NVM control register, according to an embodiment of the inventive concept.

FIG. 9 shows a flowchart of a procedure for NVM governor 150 of FIG. 1 to store information about allocated address spaces 305, 310, and 315 of FIG. 3 in NVM control register 155 of FIG. 1, according to an embodiment of the inventive concept. FIG. 9 elaborates on the operation of block 720 of FIG. 7. In FIG. 9, at block 905, NVM governor 150 of FIG. 1 can store the address masks and access modes for all address spaces 305, 310, and 315 of FIG. 3 in NVM control register 155 of FIG. 1. Alternatively, at block 910, NVM governor 150 of FIG. 1 can store only the address masks and access modes for address spaces 305, 310, and 315 of FIG. 3 that do not use the byte-addressable access mode. Then, if a required address, such as required address 605 of FIG. 6, cannot be found in the address masks of NVM control register 155 of FIG. 1, address space 305, 310, or 315 of FIG. 3 can be assumed to use the byte-addressable access mode. In other words, the byte-addressable access mode can be considered the default access mode for any address not masked in NVM control register 155 of FIG. 1.

Two comments about block 910 are worth mentioning. First, establishing the byte-addressable access mode as the default access mode is a choice. But other access modes, such as the block-addressable access mode, can be considered the default access mode, in which case address masks associated with block-addressable address spaces can be omitted instead. Second, if NVDIMMs 110 and/or 115 only offer two access modes (such as byte-addressable address mode and block-addressable address mode), then the access mode can be omitted from NVM control register 155 of FIG. 1 entirely, as storing an address mask in NVM control register 155 of FIG. 1 by itself identifies the appropriate access mode.

Figure 10:
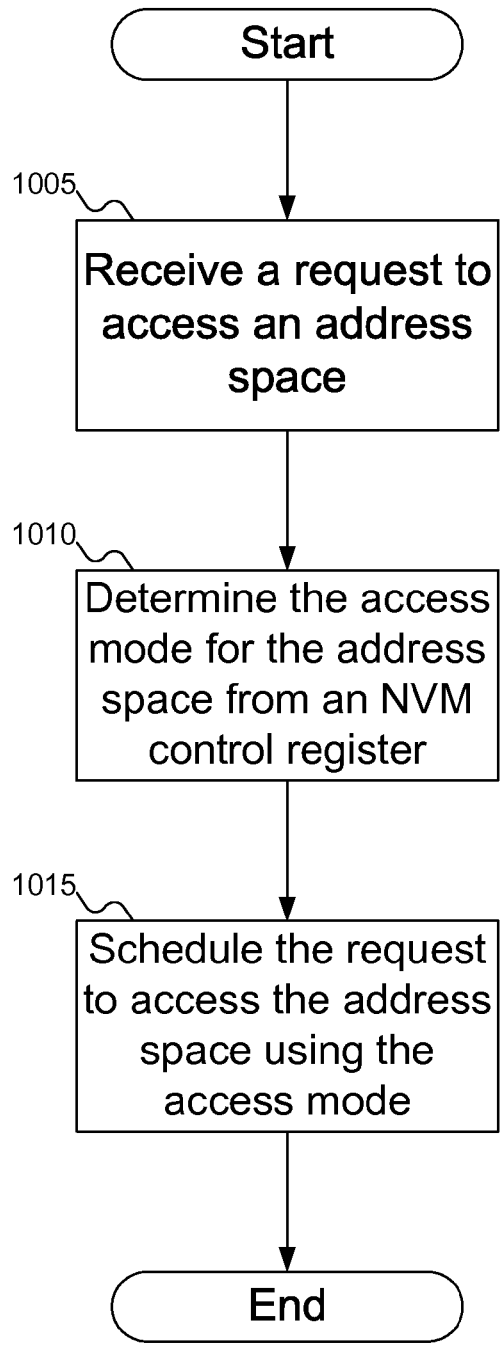
FIG. 10 shows a flowchart of a procedure for an NVM governor to handle a request to access an address in NVDIMM, according to an embodiment of the inventive concept.

FIG. 10 shows a flowchart of a procedure for NVM governor 150 of FIG. 1 to handle a request to access an address in NVDIMMs 110 and/or 115 of FIG. 1, according to an embodiment of the inventive concept. In FIG. 10, at block 1005, NVM governor 150 of FIG. 1 can receive a request to access an address from an application. At block 1010, NVM governor 150 of FIG. 1 can determine the access mode appropriate for the requested address from NVM control register 155 of FIG. 1. NVM governor 150 of FIG. 1 can accomplish this determination by comparing (potentially in parallel) the requested address with the address masks stored in NVM control register 155 of FIG. 1. When a match is found, the corresponding access mode can be selected from NVM control register 155 of FIG. 1 as the determined access mode.

Figure 11:
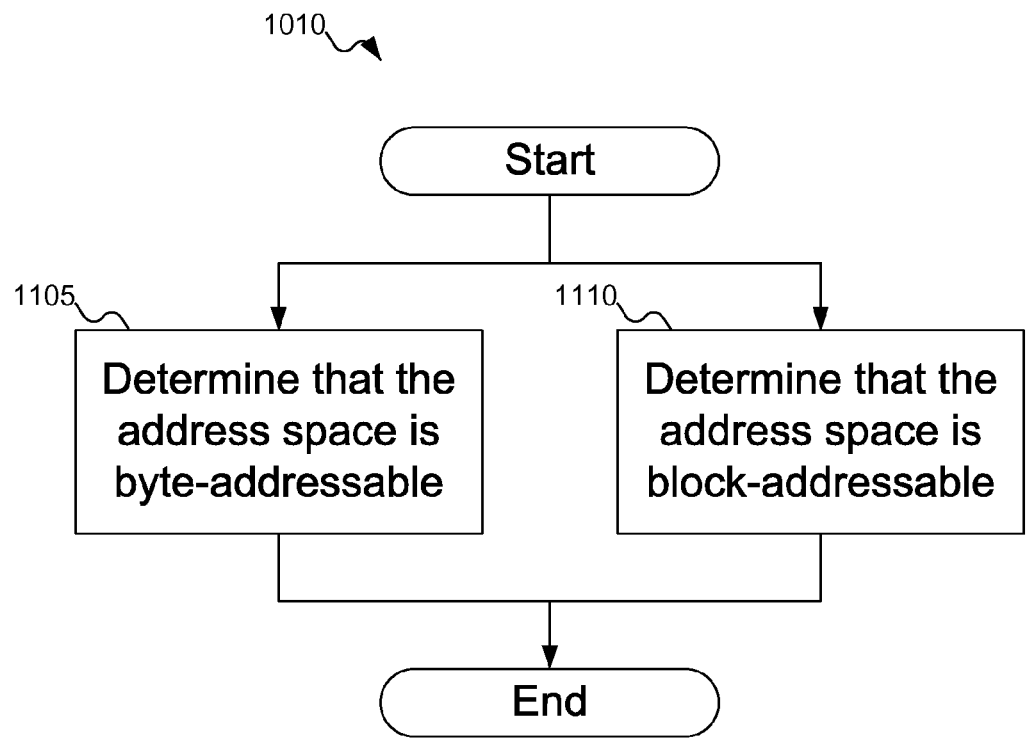
FIG. 11 shows a flowchart of a procedure for an NVM governor to determine the access mode for a requested address, according to a first embodiment of the inventive concept.

FIG. 11 shows a flowchart of a procedure for NVM governor 150 of FIG. 1 to determine the access mode for requested address 605 of FIG. 6, according to a first embodiment of the inventive concept. FIG. 11 elaborates on the operation of block 1010 of FIG. 10. In FIG. 11, at block 1105, NVM governor 150 of FIG. 1 can determine that address space 305, 310, or 315 of FIG. 3 uses a byte-addressable access mode. Alternatively, at block 1110, NVM governor 150 of FIG. 1 can determine that address space 305, 310, or 315 of FIG. 3 uses a block-addressable access mode. In addition, if NVDIMMs 110 and/or 115 support additional access modes, FIG. 11 can be modified to reflect how to determine other access modes.

Figure 12:
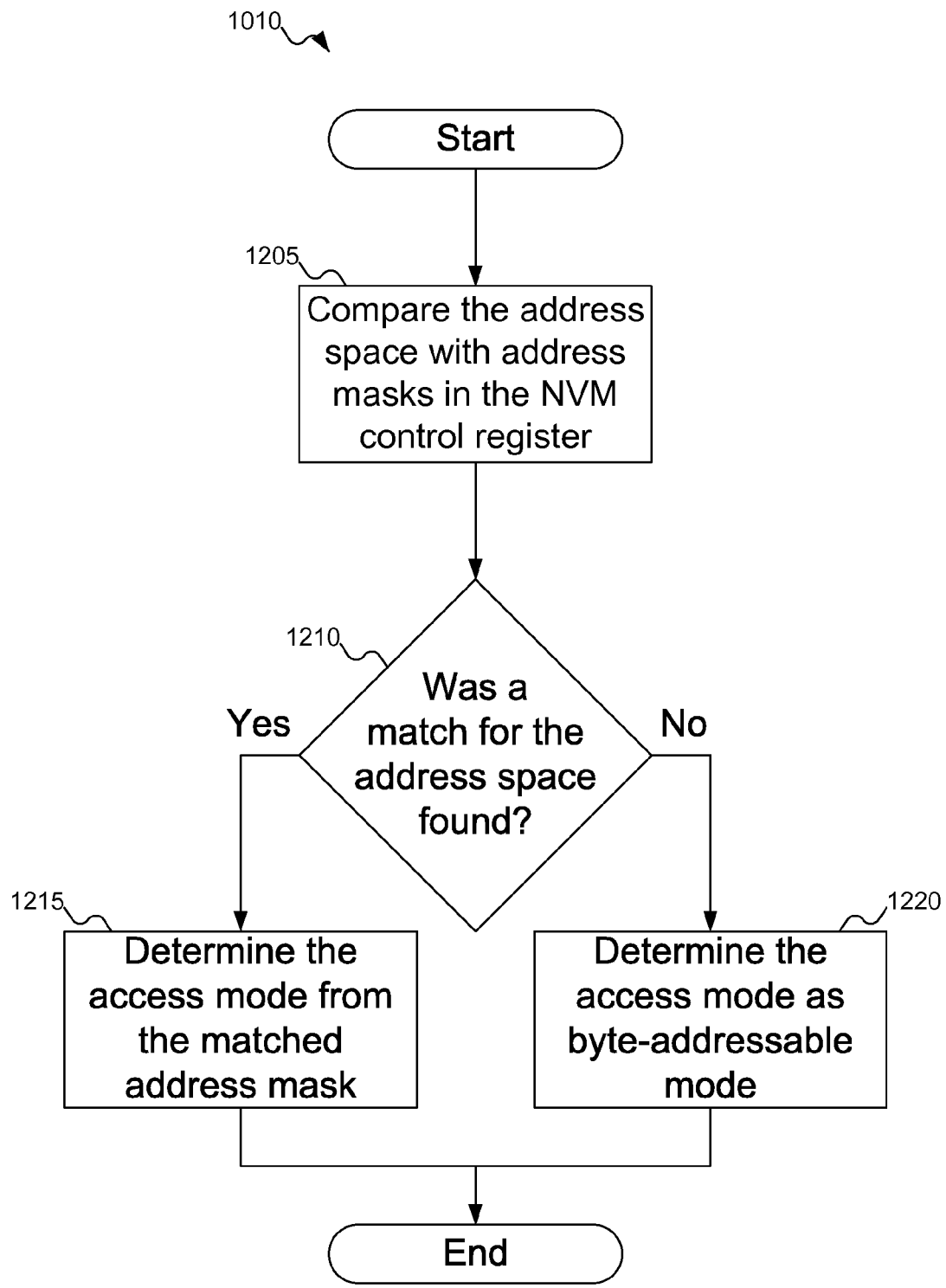
FIG. 12 shows a flowchart of a procedure for an NVM governor to determine the access mode for a requested address, according to a second embodiment of the inventive concept.

FIG. 12 shows a flowchart of a procedure for NVM governor 150 of FIG. 1 to determine the access mode for requested address 605 of FIG. 6, according to a second embodiment of the inventive concept. FIG. 12 elaborates on the operation of block 1010 of FIG. 10. In FIG. 12, at block 1205, NVM governor 150 of FIG. 1 can compare the requested address with the address masks in NVM control register 155 of FIG. 1. At block 1210, NVM governor 150 of FIG. 1 can determine if a match was found. If a match was found, then at block 1215, NVM governor 150 of FIG. 1 can determine the access mode for the requested address as the access mode stored in NVM control register 155 of FIG. 1 corresponding to the matched address mask. Otherwise, at block 1220, NVM governor 150 of FIG. 1 can determine the access mode to be the byte-addressable access mode (or whichever access mode is specified as the default access mode, in case byte-addressable access mode is not the default).

Figure 13:
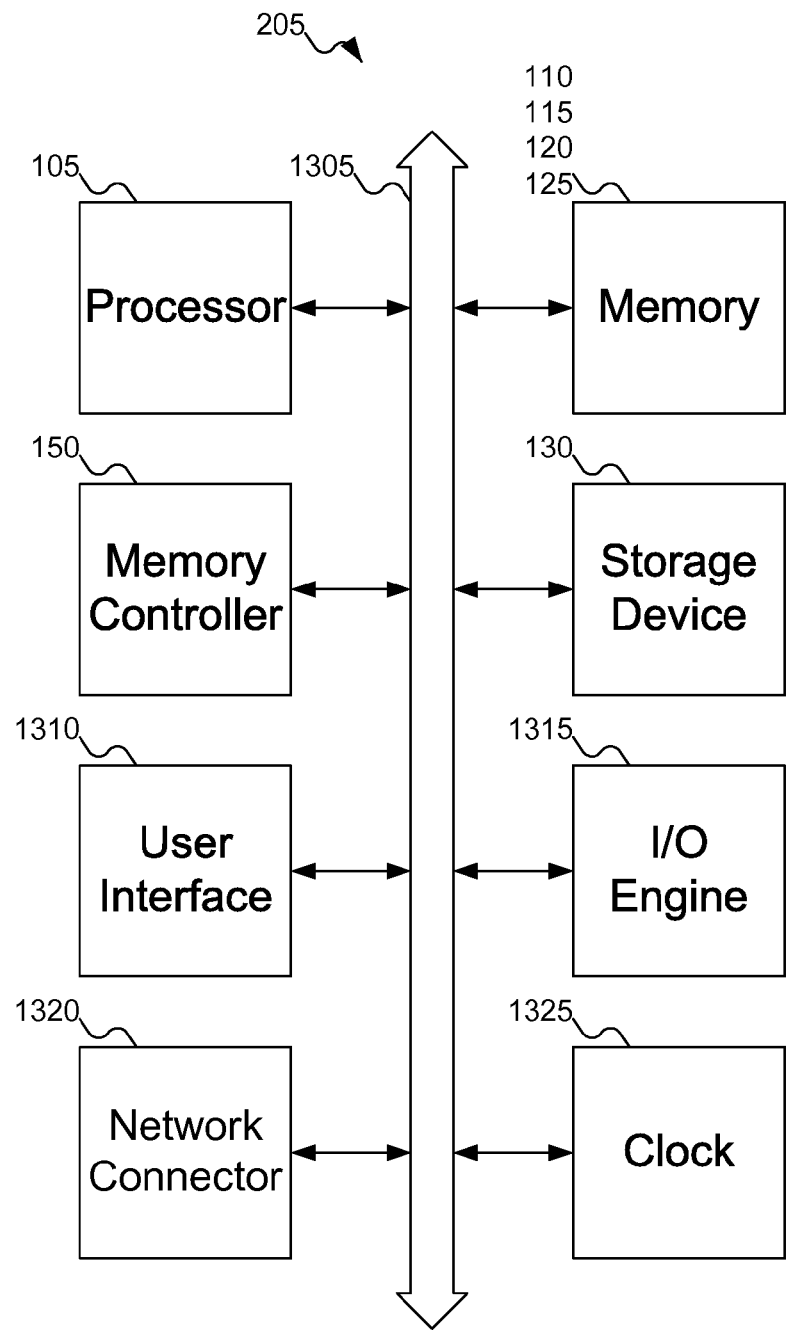
FIG. 13 shows a device that can use NVDIMMs for memory and/or storage, as described above with reference to FIGS. 1-12.

The following discussion is intended to provide a brief, general description of a suitable machine or machines in which certain aspects of the inventive concept can be implemented. Referring to FIG. 13, typically, machine or machines 205 include system bus 1305 to which are attached one or more processors 105, memory 110, 115, 120, and 125, e.g., random access memory (RAM), read-only memory (ROM), or other state preserving medium, memory controller 150, storage devices 130, user interface 1310, and input/output interface ports that can be managed using input/output engine 1315. Machine or machines 205 can also include network connector 1320, which can be, for example, an Ethernet connector. Clock 1325 can be used to coordinate the operations of the components connected to system bus 1305.

The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Embodiments of the inventive concept can include a tangible, non-transitory machine-readable medium comprising instructions executable by one or more processors, the instructions comprising instructions to perform the elements of the inventive concepts as described herein.

Having described and illustrated the principles of the inventive concept with reference to illustrated embodiments, it will be recognized that the illustrated embodiments can be modified in arrangement and detail without departing from such principles, and can be combined in any desired manner. And, although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

Embodiments of the invention can extend to the following statements, without limitation:

Statement 1. An embodiment of the inventive concept includes a system, comprising:

a Non-Volatile Dual In-Line Memory Module (NVDIMM) (110, 115);

a Non-Volatile Memory (NVM) governor (150) operative to allocate a first address space (305, 310, 315) for a first application (140) in the NVDIMM (110, 115) in a first access mode (520, 525, 530) and a second address space (305, 310, 315) for a second application (145) in the NVDIMM (110, 115) in a second access mode (520, 525, 530) and to store at least a first address mask (505, 510, 515) for the first address space (305, 310, 315) in a Non-Volatile Memory (NVM) control register (155), the first address mask (505, 510, 515) associated with associated with the first access mode (520, 525, 530).

Statement 2. An embodiment of the inventive concept includes a system according to statement 1, wherein the first access mode (520, 525, 530) is different from the second access mode (520, 525, 530).

Statement 3. An embodiment of the inventive concept includes a system according to statement 1, wherein:

the first access mode (520, 525, 530) includes a block-addressable mode; and the second access mode (520, 525, 530) includes a byte-addressable mode.

Statement 4. An embodiment of the inventive concept includes a system according to statement 3, wherein:

the NVM control register (155) is operative to store a plurality of address masks (505, 510, 515), each of the plurality of address masks (505, 510, 515) associated with an address space (305, 310, 315) using the block-addressable mode; and the NVM governor (150) is operative to treat any address space (305, 310, 315) for which no address mask is stored in the NVM control register (155) as an address space (305, 310, 315) using the byte-addressable mode.

Statement 5. An embodiment of the inventive concept includes a system according to statement 3, wherein:

the NVM control register (155) is operative to store a plurality of address masks (505, 510, 515), each of the plurality of address masks (505, 510, 515) associated with an address space (305, 310, 315) using the byte-addressable mode; and the NVM governor (150) is operative to treat any address space (305, 310, 315) for which no address mask is stored in the NVM control register (155) as an address space (305, 310, 315) using the block-addressable mode.

Statement 6. An embodiment of the inventive concept includes a system according to statement 3, wherein the NVM control register (155) is operative to store a second address mask (505, 510, 515) for the second address space (305, 310, 315) the second address mask (505, 510, 515) associated with associated with the second access mode (520, 525, 530).

Statement 7. An embodiment of the inventive concept includes a system according to statement 3, wherein the NVM control register (155) is operative to store 16 address masks (505, 510, 515) and 16 access modes (520, 525, 530) to support 16 address spaces (305, 310, 315) in the NVDIMM (110, 115), each of the 16 address masks (505, 510, 515) being 48 bits in size.

Statement 8. An embodiment of the inventive concept includes a system according to statement 3, wherein the NVM governor (150) includes allocation logic (405) to allocate the address space (305, 310, 315) in the NVDIMM (110, 115) in either byte-addressable mode or block-addressable mode.

Statement 9. An embodiment of the inventive concept includes a system according to statement 3, wherein the NVM governor (150) includes:

byte-addressable logic (410) to access the first address space (305, 310, 315) using the byte-addressable mode; and software (420) to emulate accessing the second address space (305, 310, 315) using the block-addressable mode, the software (420) using the byte-addressable logic (410).

Statement 10. An embodiment of the inventive concept includes a system according to statement 3, wherein the NVM governor (150) includes:

byte-addressable logic (410) to access the first address space (305, 310, 315) using the byte-addressable mode; and block-addressable logic (415) to access the second address space (305, 310, 315) using the block-addressable mode.

Statement 11. An embodiment of the inventive concept includes a system according to statement 3, wherein the NVM governor (150) is operative to perform a parallel access check with all address masks (505, 510, 515) in the NVM control register (155) and schedule an address request using an access mode (520, 525, 530) associated with a matched address mask.

Statement 12. An embodiment of the inventive concept includes a system according to statement 3, wherein the NVM control register (155) is operative to associate each of the plurality of address masks (505, 510, 515) with one of any number of access modes (520, 525, 530).

Statement 13. An embodiment of the inventive concept includes a system according to statement 3, further comprising a processor (105) coupled to the NVDIMM (110, 115), the processor (105) including the NVM control register (155).

Statement 14. An embodiment of the inventive concept includes a system according to statement 13, further comprising an operating system (135) capable of running on the processor (105), the operating system (135) including the NVM governor (150).

Statement 15. An embodiment of the inventive concept includes a method, comprising:

receiving (705) a request to allocate an address space in a Non-Volatile Dual In-Line Memory Module (NVDIMM) (110, 115);

receiving (710) an access mode (520, 525, 530) for the requested address space, the access mode (520, 525, 530) drawn from a set including at least two access modes;

identifying (715) an address space (305, 310, 315) in the NVDIMM (110, 115); and returning (725) the address space (305, 310, 315) as the requested address space.

Statement 16. An embodiment of the inventive concept includes a method according to statement 15, further comprising storing (720) an address mask for the address space (305, 310, 315) and the access mode (520, 525, 530) for the address space (305, 310, 315) in a Non-Volatile Memory (NVM) control register (155).

Statement 17. An embodiment of the inventive concept includes a method according to statement 16, wherein storing (720) an address mask for the address space (305, 310, 315) includes storing (910) only an address mask for the address space (305, 310, 315) if the access mode (520, 525, 530) for the address space (305, 310, 315) is a block-addressable mode.

Statement 18. An embodiment of the inventive concept includes a method according to statement 16, wherein storing (720) an address mask for the address space (305, 310, 315) includes storing (910) only an address mask for the address space (305, 310, 315) if the access mode (520, 525, 530) for the address space (305, 310, 315) is a byte-addressable mode.

Statement 19. An embodiment of the inventive concept includes a method according to statement 15, wherein receiving (710) an access mode (520, 525, 530) for the requested address space includes receiving (810) a block-addressable mode for the requested address space.

Statement 20. An embodiment of the inventive concept includes a method according to statement 15, wherein receiving (710) an access mode (520, 525, 530) for the requested address space includes receiving (805) a byte-addressable mode for the requested address space.

Statement 21. An embodiment of the inventive concept includes a method, comprising:

receiving (1005) a request to access an address space (305, 310, 315) from a Non-Volatile Dual In-Line Memory Module (NVDIMM) (110, 115);

determining (1010) an access mode (520, 525, 530) for the address space (305, 310, 315); and scheduling (1015) the request to access the address space (305, 310, 315) from the NVDIMM using the access mode (520, 525, 530).

Statement 22. An embodiment of the inventive concept includes a method according to statement 21, wherein determining (1010) an access mode (520, 525, 530) for the address space (305, 310, 315) includes determining (1110) a block-addressable mode for the address space (305, 310, 315).

Statement 23. An embodiment of the inventive concept includes a method according to statement 21, wherein determining (1010) an access mode (520, 525, 530) for the address space (305, 310, 315) includes determining (1105) a byte-addressable mode for the address space (305, 310, 315).

Statement 24. An embodiment of the inventive concept includes a method according to statement 21, wherein determining (1010) an access mode (520, 525, 530) for the address space (305, 310, 315) includes determining (1010) the access mode (520, 525, 530) from a Non-Volatile Memory (NVM) control register (155) in a processor (105).

Statement 25. An embodiment of the inventive concept includes a method according to statement 24, wherein determining (1010) the access mode (520, 525, 530) from a NVM control register (155) includes:

attempting (1205) to match the address space (305, 310, 315) with an address mask in the NVM control register (155); and determining (1215) the access mode (520, 525, 530) corresponding to the address mask in the NVM control register (155) that matches the address space (305, 310, 315).

Statement 26. An embodiment of the inventive concept includes a method according to statement 25, wherein attempting (1205) to match the address space (305, 310, 315) with an address mask in the NVM control register (155) includes comparing (1205) the address space (305, 310, 315) with each address mask in the NVM control register (155).

Statement 27. An embodiment of the inventive concept includes a method according to statement 26, wherein comparing (1205) the address space (305, 310, 315) with each address mask in the NVM control register (155) includes comparing (1205) the address space (305, 310, 315) with each address mask in the NVM control register (155) in parallel.

Statement 28. An embodiment of the inventive concept includes a method according to statement 25, wherein determining (1215) the access mode (520, 525, 530) from a NVM control register (155) further includes determining (1220) the access mode (520, 525, 530) as a byte-addressable mode if the address space (305, 310, 315) does not match an address mask in the NVM control register (155).

Statement 29. An embodiment of the inventive concept includes a method according to statement 25, wherein determining (1215) the access mode (520, 525, 530) from a NVM control register (155) further includes determining (1220) the access mode (520, 525, 530) as a block-addressable mode if the address space (305, 310, 315) does not match an address mask in the NVM control register (155).

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A system, comprising:
a Non-Volatile Dual In-Line Memory Module (NVDIMM);
a Non-Volatile Memory (NVM) governor operative to allocate a first address space for a first application in the NVDIMM in a first access mode and a second address space for a second application in the NVDIMM in a second access mode and to store at least a first address mask for the first address space in a Non-Volatile Memory (NVM) control register, the first address mask associated with the first access mode,
wherein the first address space in the NVDIMM may be allocated using the first access mode responsive to a first allocation request and allocated using the second access mode responsive to a second allocation request,
wherein the NVM control register does not store address masks for address spaces allocated using the second access mode; and
wherein the NVM governor is operable to treat any address space for which no address mask is stored in the NVM control register as an address space using the second access mode.

2. A system according to claim 1, wherein the first access mode and the second access mode are each drawn from a set including a block-addressable mode and a byte-addressable mode.

3. A system according to claim 2, wherein the NVM governor includes:
byte-addressable logic to access a byte-addressable address space using the byte-addressable mode; and
software to emulate accessing a block-addressable address space using the block-addressable mode, the software using the byte-addressable logic.

4. A system according to claim 2, wherein the NVM governor includes:
byte-addressable logic to access a byte-addressable address space using the byte-addressable mode; and
block-addressable logic to access a block-addressable address space using the block-addressable mode.

5. A system according to claim 2, wherein the NVM governor is operative to perform a parallel access check with all address masks in the NVM control register and schedule an address request using an access mode associated with a matched address mask.

6. A system according to claim 2, further comprising a processor coupled to the NVDIMM, the processor including the NVM control register.

7. A system according to claim 6, further comprising an operating system capable of running on the processor, the operating system including the NVM governor.

8. A system according to claim 1, wherein the first access mode specifies how a first Input/Output (I/O) request reads or writes data from the first address space and the second access mode specifies how a second I/O request reads or writes data from the first address space.

9. A system according to claim 1, wherein the first address space includes a first size and the second address space includes a second size, where the first size is different from the second size.

10. A method, comprising:
receiving a request to allocate an address space in a Non-Volatile Dual In-Line Memory Module (NVDIMM);
receiving an access mode for the requested address space, the access mode drawn from a set including at least two access modes;
identifying an address space in the NVDIMM;
if the access mode is not a first access mode, storing an address mask for the address space and the access mode for the address space in a Non-Volatile Memory (NVM) control register;
returning the address space as the requested address space; and
treating any address space for which no address mask is stored in the NVM control register as an address space using the first access mode.

11. A method according to claim 10, wherein storing an address mask for the address space includes storing the address mask for the address space if the access mode for the address space is a block-addressable mode.

12. A method according to claim 10, wherein storing an address mask for the address space includes storing the address mask for the address space if the access mode for the address space is a byte-addressable mode.

13. A method according to claim 10, wherein:
receiving a request to allocate an address space in a Non-Volatile Dual In-Line Memory Module (NVDIMM) includes receiving the request to allocate the address space in the NVDIMM from an application;
receiving an access mode for the requested address space includes receiving the access mode for the requested address space from the application, the access mode drawn from a set including at least two access modes;
identifying an address space in the NVDIMM includes allocating the address space in the NVDIMM using the access mode; and
returning the address space as the requested address space includes returning the address space as the requested address space to the application, the address space designed to be accessed using the access mode.

14. A method according to claim 10, wherein the address space may be allocated using the first access mode of the at least two access modes responsive to a first allocation request and allocated using a second access mode of the at least two access modes responsive to a second allocation request.

15. A method according to claim 10, wherein each of the at least two access modes specifies how an Input/Output (I/O) request reads or writes data from the address space.

16. A method according to claim 10, wherein the address space includes a first size and a second address space in the NVDIMM includes a second size, where the first size is different from the second size.

17. A method, comprising:
receiving a request to access an address space from a Non-Volatile Dual In-Line Memory Module (NVDIMM);
attempting to match the address space with an address mask in a Non-Volatile Memory (NVM) control register, wherein the NVM control register stores an access mode corresponding to each address mask;
if the address space does not match an address mask in the NVM control register, determining an access mode for the address space as a first access mode;
if the address space matches an address mask in the NVM control register, determining the access mode for the address space as the access mode corresponding to the matched address mask from the NVM control register; and
scheduling the request to access the address space from the NVDIMM using the access mode,
wherein the address space is designed to be allocated using the access mode responsive to a first allocation request and allocated using a second access mode responsive to a second allocation request.

18. A method according to claim 17, wherein determining an access mode for the address space includes determining the access mode as one of a block-addressable mode and a byte-addressable mode for the address space.

19. A method according to claim 17, wherein determining an access mode for the address space from a Non-Volatile Memory (NVM) control register includes determining the access mode from the NVM control register in a processor.

20. A method according to claim 17, wherein attempting to match the address space with an address mask in the NVM control register includes comparing the address space with each address mask in the NVM control register.

21. A method according to claim 20, wherein comparing the address space with each address mask in the NVM control register includes comparing the address space with each address mask in the NVM control register in parallel.

22. A method according to claim 17, wherein the access mode specifies how a first Input/Output (I/O) request reads or writes data from the address space and the second access mode specifies how a second I/O request reads or writes data from the address space.

23. A method according to claim 17, wherein the address space includes a first size and a second address space includes a second size, where the first size is different from the second size.

24. A method, comprising:
receiving a request to allocate an address space in a Non-Volatile Dual In-Line Memory Module (NVDIMM);
receiving an access mode for the requested address space, the access mode drawn from a set including exactly two access modes;
identifying an address space in the NVDIMM;
if the access mode is not a first access mode, storing an address mask for the address space in a Non-Volatile Memory (NVM) control register;
returning the address space as the requested address space,
wherein the access mode may be determined responsive to whether or not the address mask is stored in the NVM control register.

25. A method according to claim 24, wherein storing an address mask for the address space includes storing the address mask for the address space if the access mode for the address space is a block-addressable mode.

26. A method according to claim 24, wherein storing an address mask for the address space includes storing the address mask for the address space if the access mode for the address space is a byte-addressable mode.

27. A method according to claim 24, wherein storing an address mask for the address space in a Non-Volatile Memory (NVM) control register includes storing the address mask and the access mode for the address space in the NVM control register.

* * * * *